United States Patent [19]
Wu

[11] Patent Number: 5,557,534
[45] Date of Patent: Sep. 17, 1996

[54] FORMING ARRAY WITH METAL SCAN LINES TO CONTROL SEMICONDUCTOR GATE LINES

[75] Inventor: I-Wei Wu, Los Altos, Calif.

[73] Assignee: Xerox Corporation, Stamford, Conn.

[21] Appl. No.: 367,983

[22] Filed: Jan. 3, 1995

[51] Int. Cl.$^6$ ............................................. H01L 21/72
[52] U.S. Cl. .................... 364/491; 364/488; 364/489; 364/490; 327/565; 437/51
[58] Field of Search ........................... 364/488, 489, 364/490, 491; 257/202, 203, 207, 208, 211, 773, 401; 327/565; 437/51, 187, 188

[56] References Cited

U.S. PATENT DOCUMENTS

| | | | |
|---|---|---|---|
| 4,059,461 | 11/1977 | Fan et al. | 437/181 |
| 4,691,434 | 9/1987 | Percival et al. | 437/188 |
| 5,060,045 | 10/1991 | Owada et al. | 257/211 |
| 5,075,753 | 12/1991 | Kozomo | 257/207 |
| 5,243,208 | 9/1993 | Isomura et al. | 257/211 |
| 5,291,043 | 3/1994 | Arakawa | 257/208 |
| 5,324,674 | 6/1994 | Possin et al. | 437/41 |
| 5,346,833 | 9/1994 | Wu | 437/181 |
| 5,348,902 | 9/1994 | Shimada et al. | 437/51 |
| 5,367,187 | 11/1994 | Yuen | 257/202 |
| 5,369,595 | 11/1994 | Gould et al. | 364/490 |
| 5,369,596 | 11/1994 | Tokumaru | 364/491 |
| 5,388,055 | 2/1995 | Tanizawa et al. | 364/491 |
| 5,391,507 | 2/1995 | Kwasnick et al. | 437/187 |
| 5,412,493 | 5/1995 | Kunii et al. | 359/59 |
| 5,414,547 | 5/1995 | Matsuo et al. | 359/67 |
| 5,424,857 | 6/1995 | Aoki et al. | 359/59 |
| 5,491,347 | 2/1996 | Allen et al. | 257/59 |

OTHER PUBLICATIONS

Lewis, A., and Wu, I-W., "Polysilicon TFTs for Active Matrix Liquid Crystal Displays," IEICE Transactions, vol.J76-C-II, No. 5, May 1993, pp. 211-226.

Wu, I-W., "High-definition displays and tecnhology trends in TFT-LCDs," Journal of the SID, vol. 2, No. 1, 1994, pp. 1-14.

Wu, I-W., "Polycrystalline Silicon Thin Film Transistors for Liquid Crystal Displays," Solid State Phenomena, vols. 37-38, 1944, pp. 553-564.

Wu, I-W., Stuber, S., Tsai, C. C., Yao W., Lewis, A., Fulks, R., Chiang, A., and Thompson, M., "Processing and Device Performance of Low-Temperature CMOS Poly-TFTs on 18.4-in.-Diagonal Substrates for AMLCD Application," SID 92 Digest, 1992, pp. 615-618.

Martin, R., Chuang, T., Steemers, H., Allen, R., Fulks, R., Stuber, S., Lee, D., Young, M., Ho, J., Nguyen, M., Meuli, W., Fiske, T., Bruce, R., Thompson, M., Tilton, M., and Silverstein, L. D., "P-70: A 6.3-Mpixel AMLCD," SID 93 Digest, 1993, pp. 704-707.

Primary Examiner—Kevin J. Teska
Assistant Examiner—Tyrone V. Walker

[57] ABSTRACT

Array circuitry formed at a surface of a substrate includes a first conductive layer with M scan lines, a second conductive layer with N data lines, and cell circuitry for a region in which the mth scan line and the nth data line cross. The cell circuitry includes a component with a data lead for receiving signals from or providing signals to the nth data line. A first semiconductor layer of the cell circuitry includes a first line with a channel between a connecting point to the nth data line and a connecting point to the component's data lead. A second semiconductor layer includes a second line extending from a connecting point to the mth scan line and crossing the first line at the channel. The first and second conductive layers and the cell circuitry are formed with electrical connections at the connecting points so that signals on the mth scan line control conductivity of the first line between the nth data line and the data lead. The semiconductor layers can be polysilicon. The first semiconductor layer can be formed before the second, with the first line electrically connected to the data lead by implanting a dopant. The connections to the mth scan line and the nth data line can be metal/semiconductor interfaces, with the first conductive layer deposited on the second line and with the second conductive layer deposited on the first line through an opening in an insulating layer.

22 Claims, 8 Drawing Sheets

FORMING ARRAY WITH METAL SCAN LINES TO CONTROL SEMICONDUCTOR GATE LINES

BACKGROUND OF THE INVENTION

The present invention relates to circuitry formed on substrates. More specifically, the present invention relates to arrays.

Lewis, A., and Wu, I-W., "Polysilicon TFTs for Active Matrix Liquid Crystal Displays," IEICE TRANSACTIONS, Vol. J76-C-II, No. 5, May 1993, pp. 211–226, describe fabrication of polysilicon (poly-Si) thin film transistors (TFTs) and poly-Si active matrix liquid crystal display (AMLCD) pixel designs. Section 2.3 describes process flow and device architectures in relation to FIG. 2, which shows TFT device cross-sections. Section 2.6 describes gate materials, indicating that poly-Si gate electrodes have been widely used, but that gate line resistance is difficult to reduce. Cr, ITO, or PtSi are alternatives, and the use of a thin aluminum layer over a conventional poly-Si gate can reduce effective gate line resistance. FIG. 10 shows a schematic of typical AMLCD pixel circuitry, and section 4 discusses poly-Si TFT AMLCD pixel design issues. Section 5 describes peripheral drive circuits integrated on a glass or quartz substrate with an active matrix, which is the main advantage of poly-Si TFTs over amorphous devices for AMLCDs.

Wu, I-W., "High-definition displays and technology trends in TFT-LCDs," Journal of the SID, Vol. 2, No. 1, 1994, pp. 1–14, describes various liquid crystal displays (LCDs), focusing on AMLCDs with TFTs. Section 3 on page 5 compares amorphous silicon (a-Si) TFT-AMLCDs with poly-Si TFT-AMLCDs. FIGS. 2–5 show general features of conventional TFT-AMLCDs. As described in relation to FIG. 3, TFTs act as switches controlled by gate electrodes, connecting data lines to pixel electrodes. As explained at page 6 last paragraph-page 7 first paragraph in relation to FIGS. 4 and 5, a storage capacitor Cst helps maintain pixel voltage during a frame time. An electrode of Cst can be connected either to a previous gate line or to an independent conductive line to which an appropriate dc voltage is applied; a low-resistance gate-line is desired to minimize adverse effects of RC delay. Section 5 on page 8 describes a-Si AMLCDs in which the gate bus-line material is MoTa alloy, Cr, or low-resistivity Al film. Section 5 also describes self-alignment fabrication of a-Si TFTs, and discusses the relationship between aperture ratio and gate bus-line sheet resistivity, mentioning that an aluminum gate-line is popular. FIG. 11 shows a schematic cross section of a poly-Si TFT AMLCD, described in section 7. Section 7 mentions that poly-Si TFTs allow fabrication of driver circuits and a TFT cell array on the same glass substrate.

SUMMARY OF THE INVENTION

The invention addresses problems that affect arrays of circuitry fabricated on substrates.

A two-dimensional (2D) array, for example, can include two sets of conductive lines extending in perpendicular directions, as illustrated by FIG. 3 of the Wu article described above. Each line extending in one direction can provide signals to a column of the array; each line extending in another direction can provide signals to a row of the array. Conventionally, each row-column position in a 2D array includes circuitry, sometimes called a "cell," that responds to or provides signals on the lines for the cell's row and column combination. Through one set of parallel lines, illustratively called "data lines," each cell receives or provides signals that determine or indicate its state. Through the other set of parallel lines, illustratively called "scan lines," each cell along a scan line receives a signal that enables the cell to receive signals from or to provide signals to its data line. The area of each cell that is bounded by data lines and scan lines, referred to herein as the "cell area," can serve as a transducer, providing or receiving signals to or from sources outside the array. In conventional arrays, each scan line provides a periodic scan signal that enables a component in each cell connected to the scan line to receive a signal from or provide a signal to its data line during a brief time interval of each cycle. Therefore, tight synchronization of the scan signals with signals on the data lines is critical to successful array operation. Also, the scan signals must maintain high quality transitions across an array. If a scan line has high resistance, its propagation delay is also high, which causes signal distortion, preventing accurate signal synchronization and causing inaccurate loading or extraction of data.

Some conventional techniques address the scan line resistance problem by using metal scan lines. But each cell's circuitry conventionally includes a semiconductor channel, and the conductivity of the channel is conventionally controlled by the scan signals, also referred to as "gate signals" by analogy to the gate of a transistor. Therefore, a metal scan line conventionally extends over the semiconductor channel, causing problems with fabrication processes such as ion implantation and hydrogenation and also causing problems with design such as line width control for scaling.

Such fabrication problems are especially serious for poly-Si TFTs: Hydrogenation to passivate defects in a poly-Si channel affects poly-Si differently than metal. Also, self-aligned ion implantation requires a shrunken metal line, leading to line width control problems, especially for high density displays.

Some conventional techniques use poly-Si scan lines in poly-Si TFT arrays, providing excellent gate oxide integrity in each TFT because the oxide/semiconductor interface between the gate and insulator layers is stable due to compatibility of materials. This avoids fabrication problems but increases scan line resistance, precluding sufficiently large array sizes or sufficiently high densities for many applications. To reduce poly-Si scan line resistance, it has been proposed to provide an aluminum shunt, since the resistivity of doped aluminum is as low as 0.3 ohms/square or less while that of poly-Si is 30–50 ohms/square. But hydrogenation to passivate channel defects would also degrade the shunted scan line due to atomic mixing at the interface between metal and poly-Si.

The invention provides a more elegant solution to the scan line resistance problem, a solution that also avoids fabrication problems. The invention is based on the discovery of a technique that preserves the advantages of a metal scan line and also obtains the advantages of a poly-Si gate line. The technique provides a metal scan line and a semiconductor line connected to the scan line. The semiconductor line crosses a channel and is conductive so that signals on the scan line control conductivity of the channel.

The technique can be implemented in a method that forms array circuitry at a surface of the substrate. The method forms one patterned conductive layer that includes M scan lines extending approximately in a first direction and forms another patterned conductive layer that includes N data lines extending approximately in a second direction different than the first. The scan lines include metal. For each value of m from 1 through M and for each value of n from 1 through N, the array circuitry includes a crossing region in which the mth scan line and the nth data line cross.

The method also forms cell circuitry for at least one of the crossing regions, connected to the mth scan line and the nth data line. The cell circuitry includes a component that has a data lead for receiving signals from or providing signals to the nth data line. To form the cell circuitry the method forms a first patterned semiconductor layer that includes a first line extending between a first connecting point for connecting to the nth data line and a second connecting point for connecting to the data lead. The first line includes a channel between the first and second connecting points. The method also forms a second patterned semiconductor layer that includes a second line that extends from a third connecting point for connecting to the mth scan line. The second line crosses the first line at the channel and is conductive.

In forming the first patterned conductive layer, the second patterned conductive layer, and the cell circuitry, the method also forms electrical connections at the first, second, and third connecting points so that signals on the mth scan line control conductivity of the first line between the nth data line and the data lead.

Each of the first and second patterned semiconductor layers can include polysilicon. The first layer can be formed before the second layer so that the channel is between the second line and the substrate and therefore is shielded from implantation of a dopant.

The first patterned semiconductor layer can include the data lead, connected to the first line. Therefore, the method can form an electrical connection at the second connecting point by implanting a dopant in the data lead and the connected part of the first line. Further, the method can lithographically produce the first patterned semiconductor layer so that it includes a connected shape with the first line, the data lead, and a capacitor electrode that is along part of the mth scan line. Then, an insulating layer between the capacitor electrode and the mth scan line provides a capacitive element. The second line, channel leads in the first line, and the capacitor electrode can be doped at once, eliminating the need for a separate capacitor mask and a separate capacitor implant.

To form an electrical connection at the first connecting point, the method can lithographically produce an opening through the insulating layer to the first connecting point. Then the method can deposit a data line layer that goes through the opening to form a connecting interface between the data line layer and the first line. The method can lithographically produce the data lines from the data line layer.

The method can form a metal/semiconductor interface between the mth scan line and the second line at the third connecting point. For example, the method can deposit a scan line layer that includes metal over the second line, forming the metal/semiconductor interface. Then the method can lithographically produce the scan lines from the scan line layer.

The technique described above is advantageous because it provides a metal scan line that can have very low resistance, and therefore very low signal delay and low signal distortion. Because the scan line need not be modified to form a gate, it can be a straight, uniform, continuous metal line, with no kink or other modification that would reduce conductivity.

The technique is also advantageous because it provides a channel that is controlled by a semiconductor line rather than a metal line. Because the scan line can be spaced apart from the channel region, hydrogenation and other processes that relate to poly-Si TFT fabrication, such as ion implantation to form self-aligned source and drain, do not cause interaction between metal from the scan line and the channel, so that the technique can be used in a poly-Si TFT array.

The technique is also advantageous because it permits very efficient use of cell area. Each cell's circuitry can include one or two channels between the edges of the cell's data line, with a semiconductor gate line that connects to the cell's scan line in the region where the scan line crosses the data line. As a result, the channels and the gate line do not occupy cell area.

The technique is especially advantageous for arrays in which a cell includes a storage capacitor. As illustrated in FIGS. 4 and 5 of the Wu article, each cell of a 2D array can include a capacitor to maintain a voltage within the cell for an appropriate storage time. In an LCD array or a liquid crystal light valve (LCLV) array, for example, the capacitor can hold a voltage that controls orientation of adjacent liquid crystal material. In a sensor array, on the other hand, the capacitor can hold a voltage that indicates a quantity of energy received by a sensor for the cell. Similarly, in an energy emitting array, the capacitor can hold a voltage that indicates a quantity of energy to be emitted by an emitter for the cell.

One advantage is that the technique simplifies fabrication of a capacitor under a scan line, with a part of the scan line forming a first electrode and with a second electrode formed in a semiconductor layer between the scan line and the substrate. Conventionally, capacitor fabrication requires an additional masking operation to select the capacitor's electrode area for doping while shielding semiconductor channels from being doped. This requires a tradeoff, however, between the level of capacitor implant doping necessary to prevent voltage dependent capacitance and the damage to the $Si/SiO_2$ interface from stripping implant doped photoresist. Some conventional techniques extend the second electrode beyond the edges of the scan line to provide regions that receive the additional implant.

The technique permits fabrication of the capacitor in the same way as source/drain regions, without an additional masking operation and an additional implantation operation. Therefore, the capacitor is heavily doped, ensuring that capacitance is not voltage dependent. Also, the second electrode need not extend beyond the edges of the scan line, but can have edges aligned with the scan line's edges. Further, the second electrodes of adjacent cells need only be separated by the minimum spacing necessary for isolation without coupling, approximately 1 μm in a wafer-sized array and approximately 2 or 3 μm in a large area array. In other words, the second electrodes can extend as far as possible into the crossing regions, maximizing capacitor area. As a result of its maximized area, the capacitor need not occupy any part of the cell area bounded by the scan lines and data lines.

Because the second electrodes are very thin semiconductor layers and are separated by small spacings, a metal scan line formed over them can have a cross section that is nearly uniform across the array, with the same width and thickness at all points along its length. Therefore, conductivity of the scan line is also maximized.

As a result of maximizing capacitor area under the scan line, the technique permits greater useful area and greater cell density without sacrificing cell area. Therefore, the technique is especially advantageous in light transmissive, sensing, or emitting applications, such as displays, light valves, and sensors. Furthermore, when implemented with poly-Si TFTs, the technique permits integration of peripheral circuitry around the outer boundary of the array on the same substrate, providing driving or sensing circuitry for the scan lines and data lines.

The following description, the drawings, and the claims further set forth these and other aspects, objects, features, and advantages of the invention.

DETAILED DESCRIPTION

A. Conceptual Framework

Figure 1:
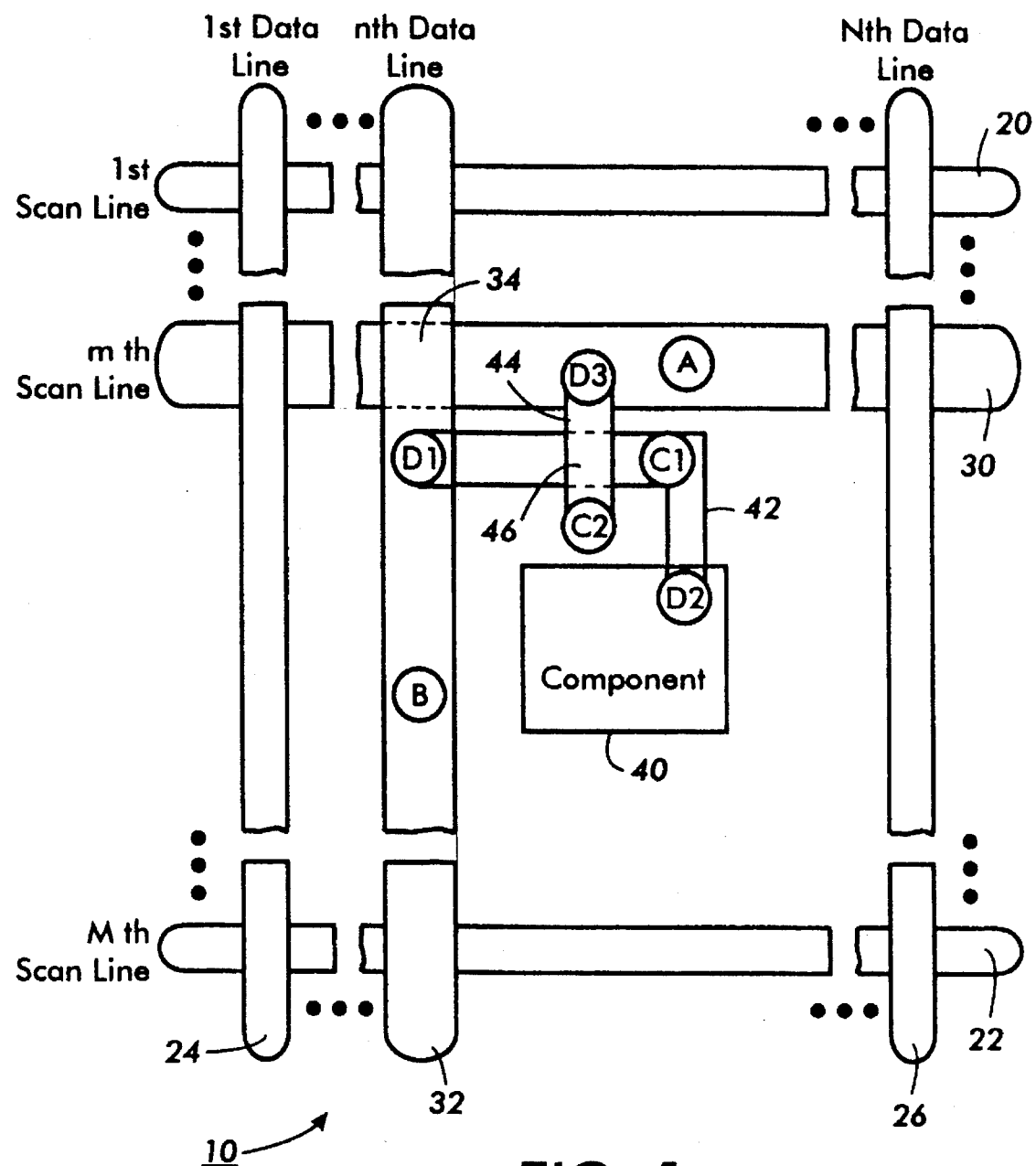
FIG. 1 is a schematic layout diagram showing functions performed in fabricating an array in which a cell's circuitry includes a metal scan line and a conductive semiconductor line that provide gate signals controlling conductivity of a channel.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

An operation "deposits" a layer by depositing material to form the layer, such as by physical or chemical vapor deposition.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

During production of an electric structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "crossing region" is a region in which two lines cross, such as a scan line and a data line.

An "insulating layer" is a layer formed of a non-conductive material.

A part of a layer "has an edge" if another, complementary part of the layer has been removed by one or more processes, leaving the part of the layer. The edge is the boundary between part of a layer and its complementary part. A "width" of a part of a layer such as a line is a distance between two edges.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A component in one layer is "between" edges in another layer if the projection of the component onto the surface of the substrate is between the projections of the edges.

A "connected shape" in a thin-film structure formed at a surface of a substrate is a part of the structure that is formed from a layer and is bounded by an edge that extends between a first side toward the surface and a second side away from the surface.

A "channel" is a part of a component through which electric current can flow. A channel is "conductive" when the channel is in a state in which current can flow through it.

A line "includes" a channel when a part of the line is the channel.

Two channels in a line are "in series" with each other if both must be conductive for the line to be conductive.

A "channel lead" is a lead that connects to a channel. A channel may, for example, extend between two channel leads.

A "channel region" is a region of an electric structure in which a channel occurs.

A "charge carrier" is a real or fictitious particle that can transport charge through a channel to produce a current; electrons and holes are examples of charge carriers. A "charge carrier source" is an ion, atom, molecule, or other feature of a channel that can provide a charge carrier. A "charge carrier destination" is an ion, atom, molecule, or other feature of a channel that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

Charge carrier sources and destinations are "positioned" so that an event occurs if the densities, types, or other characteristics of the sources and destinations vary with position in a way that causes the event to occur.

A "dopant" is an ion, atom, molecule, or other particle that can be added to a channel or other part of an integrated circuit during production and that serves as a charge carrier source when the integrated circuit is in use. An "n-type dopant" provides charge carriers of negative sign and a "p-type dopant" provides charge carriers of positive sign.

A process "implants" a dopant if the process causes particles of the dopant to enter a part of an integrated circuit.

A dopant "dopes" a part of a layer if the dopant is implanted in the part. A line is "doped" if it contains an implanted dopant.

An operation "forms" an electrical connection by producing an electrical structure through which current can flow between components. Deposition can form an electrical connection by producing a metal/semiconductor interface or a conductive metal line. Doping can form an electrical connection by producing a doped semiconductor line.

A "transistor" is a component that has a channel that extends between two channel leads, and that also has a third lead-referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

Signals on a line "control conductivity" of a channel if the signals can change conductivity of the channel. Such a line may be called a "gate line" and the signals may be called "gate signals."

Two components are electrically connected "under control of" a line if a signal on the line can change conductivity of another line connecting the two components. For example, a line that includes a channel can electrically connect two components under control of a gate line.

A "thin-film transistor" or "TFT" is a transistor that is part of a thin film structure.

A "capacitive element" is a component that stores a voltage level by storing charge. A capacitive element may include two conductive components, called "electrodes," separated by an insulating layer.

In a 2D array of circuitry, a cell's area may include a "cell electrode." A cell electrode may serve as one electrode of a capacitor whose other electrode is external to the array.

An "image" is a pattern of physical light.

An "image output device" is a device that can provide output defining an image.

A "display" is an image output device that provides information in a visible form.

A "liquid crystal cell" is an enclosure containing a liquid crystal material.

A "liquid crystal display" or "LCD" is a display that includes a liquid crystal cell with a light transmission characteristic that can be controlled in parts of the cell by an array of light control units to cause presentation of an image.

An "active matrix liquid crystal display" or "AMLCD" is a liquid crystal display that includes a liquid crystal cell and an array of cell circuitry that can cause presentation of an image by the liquid crystal cell.

B. General Features of the Invention

Figure 2:
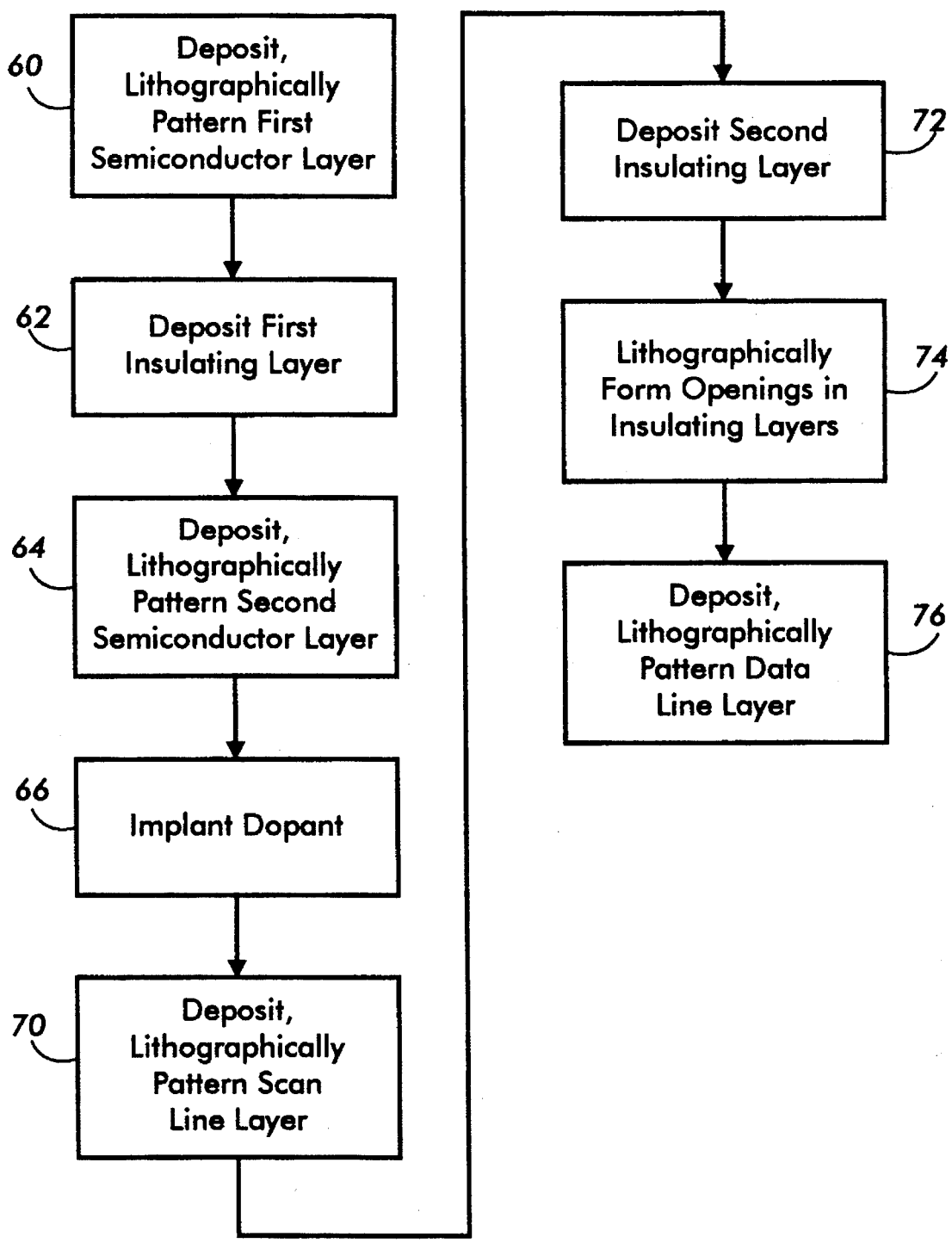
FIG. 2 is a flow chart showing general acts that can implement the functions shown in FIG. 1.
Figure 3:
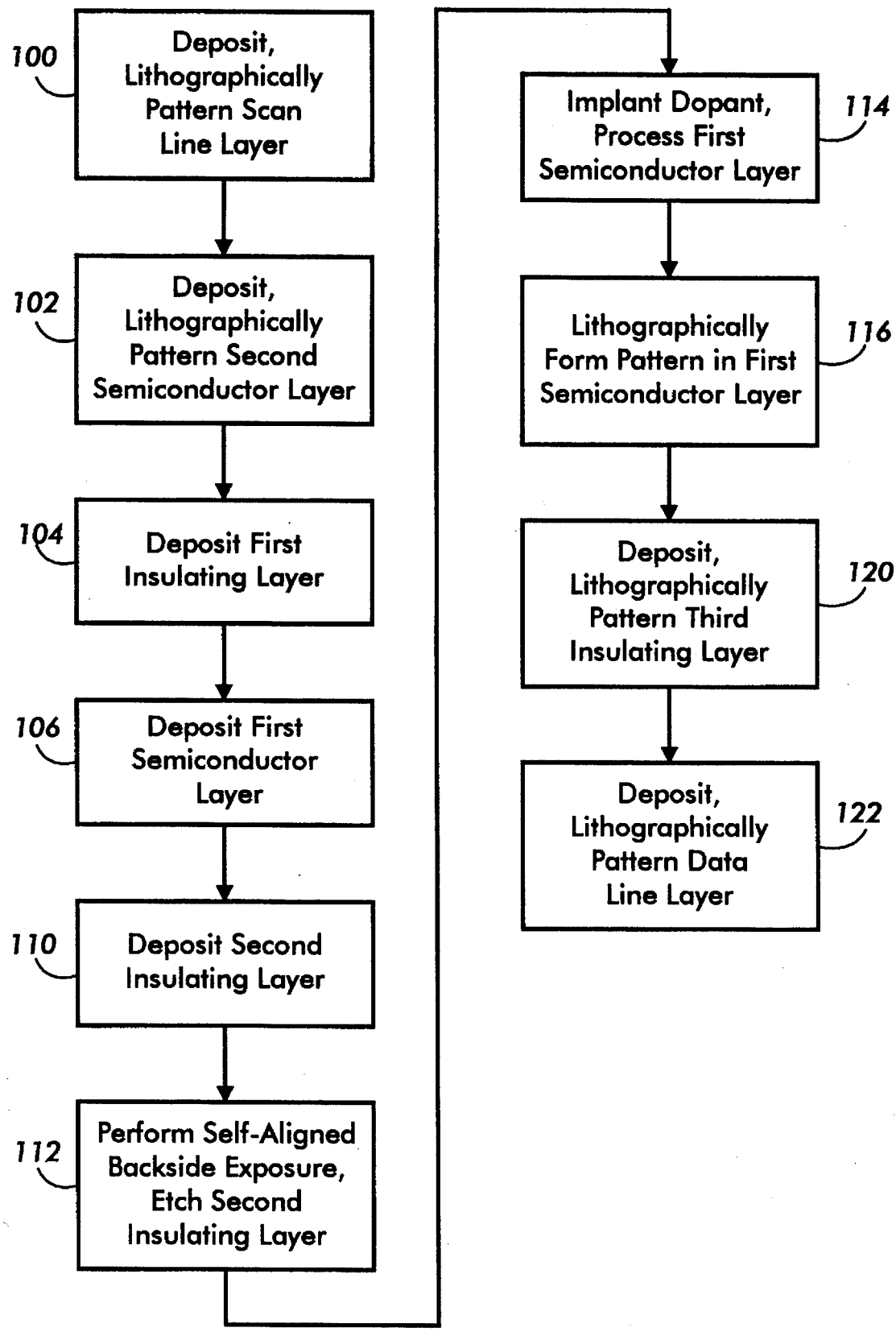
FIG. 3 is a flow chart showing other general acts that can implement the functions shown in FIG. 1.

FIGS. 1–3 show general features of the invention. FIG. 1 shows schematically functions in forming an M×N array in which a cell's circuitry includes a semiconductor line that is connected to a metal scan line and that crosses another semiconductor line at a channel between connections to a data line and a data lead. FIG. 2 shows general acts in implementing the functions shown in FIG. 1. FIG. 3 shows other general acts in implementing the functions shown in FIG. 1.

Array 10 in FIG. 1 includes M scan lines, from first scan line 20 through Mth scan line 22, and N data lines, from first data line 24 through Nth data line 26. Cell circuitry connected to mth scan line 30 and nth data line 32 is illustratively shown in more detail.

As shown in FIG. 1, array 10 can be produced by performing a number of functions. One function, designated "A," forms mth scan line 30 and the other scan lines, each of which includes metal. Another function, designated "B," forms nth data line 32 and the other data lines, crossing the scan lines in crossing regions such as crossing region 34.

Another function is to produce cell circuitry for each crossing region. This function produces component 40, which has a data lead for receiving signals from or providing signals to nth data line 32. In addition, one part of this function, designated "C1," forms semiconductor line 42 connected between nth data line 32 and a data lead of component 40. Another part of this function, designated "C2," forms semiconductor line 44 which is conductive and which crosses semiconductor line 42 at channel 46.

Another function is to form electrical connections at appropriate connecting points. One part of this function, designated "D1," forms an electrical connection between nth data line 32 and semiconductor line 42. A second part of this function, designated "D2," forms an electrical connection between semiconductor line 42 and the data lead of component 40. A third part of this function, designated "D3," forms an electrical connection between mth scan line 30 and semiconductor line 44. Because of these connections, signals on mth scan line 30 control conductivity of channel 46.

The functions in FIG. 1 could be implemented in many ways using various techniques for producing circuitry on a substrate.

FIG. 2 shows a sequence of general acts that can implement the functions in FIG. 1.

The act in box 60 deposits and lithographically patterns a first semiconductor layer, producing semiconductor line 42 in FIG. 1. The act in box 60 can also produce the data lead and other parts of component 40, such as a capacitor electrode.

The act in box 62 deposits a first insulating layer over the pattern from box 60. Then, the act in box 64 deposits and lithographically patterns a second semiconductor layer, producing semiconductor line 44 in FIG. 1.

The act in box 66 then implants a dopant. Because semiconductor line 44 crosses channel 46, channel 46 is shielded from the dopant, but other parts of semiconductor line 42 are doped, forming channel leads for channel 46. The act in box 66 can therefore form an electrical connection between semiconductor line 42 and the data lead of component 40, the function designated D2 in FIG. 1.

The act in box 70 deposits and lithographically patterns a scan line layer that includes metal, producing M scan lines 20 through 22. The act in box 70 therefore forms an electrical connection between semiconductor line 44 and mth scan line 30, by forming a metal/semiconductor interface.

The act in box 72 deposits a second insulating layer. The act in box 74 then lithographically forms openings in the first and second insulating layers to expose the connecting point at which semiconductor line 42 connects to nth data line 32. The act in box 76 then deposits and lithographically patterns a data line layer, producing N data lines 24 through 26. The act in box 76 therefore forms an electrical connection between semiconductor line 42 and nth data line 32, because the metal in the opening formed in box 74 forms a metal/semiconductor interface.

FIG. 3 shows another sequence of general acts that could be used implement the functions in FIG. 1. The sequence in FIG. 3 would produce a structure with a gate under a channel and with a top ITO layer, resembling the structure disclosed in copending, coassigned U.S. patent application No. 08/235,009, entitled "Electrically Isolated Pixel Element in a Low Voltage Activated Active Matrix Liquid Crystal Display and Method," incorporated herein by reference.

The act in box 100 deposits and lithographically patterns a scan line layer, producing scan lines. The act in box 102 then deposits and lithographically patterns a layer referred to as the "second semiconductor layer" because it includes a line that serves the same function as semiconductor line 44 in FIG. 1. Deposition of the second semiconductor layer on a scan line forms a metal/semiconductor interface, forming an electrical connection.

The act in box 104 deposits a first insulating layer over the pattern from box 102. Then, the act in box 106 deposits a layer referred to as the "first semiconductor layer" because it is subsequently etched to form a pattern that includes a line that serves the same function as semiconductor line 42 in FIG. 1.

The act in box 110 deposits a second insulating layer over the first semiconductor layer from box 106. Then, the act in box 112 performs a self-aligned back side exposure followed by an etch to lithographically pattern the second insulating layer so that it includes an island over the channel in the first semiconductor layer. The act in box 114 then implants a dopant, with the channel shielded from the dopant by the island from box 112. The act in box 114 can also anneal to activate the channel and passivate.

The act in box 116 then lithographically patterns the first semiconductor layer, producing a line that serves the same function as semiconductor line 42 in FIG. 1. The act in box 116 can also produce the data lead and other parts of component 40, such as a capacitor electrode, as in box 60 in FIG. 2.

The act in box 120 then deposits and lithographically patterns a third insulating layer so that it has openings to the first semiconductor layer at the connection points. The act in box 122 then deposits and lithographically patterns a data line layer, producing data lines. The act in box 122 therefore forms an electrical connection between the line in the first semiconductor layer and a data line, because the metal in the opening formed in box 120 forms a metal/semiconductor interface.

C. Implementation

The general features described above could be implemented in numerous ways in various arrays. An implementation described below employs poly-Si TFTs, and is suitable for an AMLCD array.

C.1. Cell Circuitry

Figure 4:
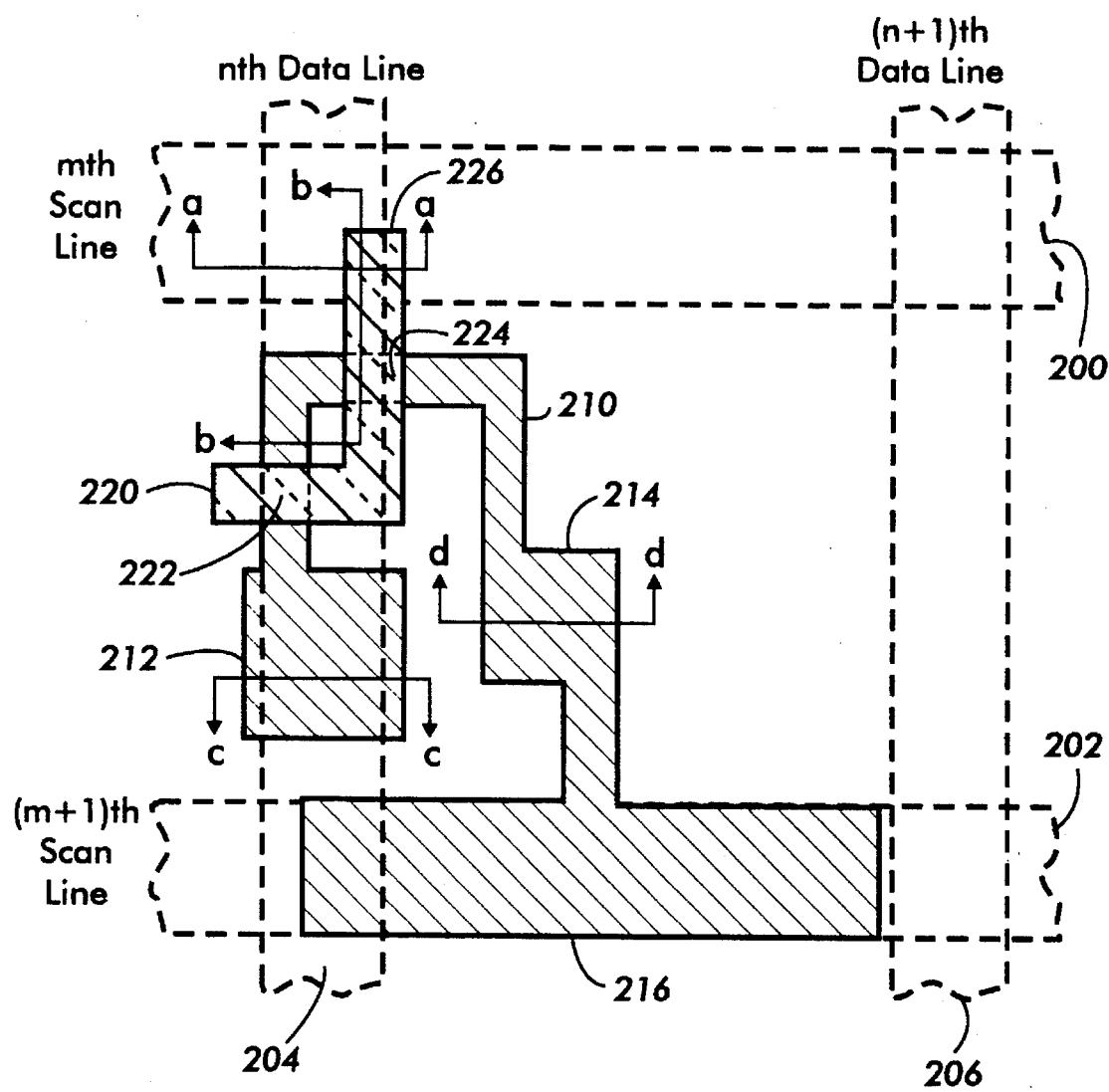
FIG. 4 is a schematic layout diagram showing semiconductor layers in a cell's circuitry.

FIGS. 4–8 illustrate cell circuitry. FIG. 4 shows a layout of first and second semiconductor layers. FIGS. 5–8 show representative cross sections of cell circuitry in FIG. 4, along lines a—a, b—b, c—c, and d—d, respectively.

FIG. 4 shows a part of an M×N array, with mth scan line 200, (m+1)th scan line 202, nth data line 204, and (n+1)th data line 206 in dashed lines. FIG. 4 also shows part of the cell circuitry for the cell that is connected to mth scan line 200 and nth data line 204.

The cell's circuitry includes first semiconductor pattern 210, with a line that extends from first connecting point 212 to second connecting point 214 and with another line extending from second connecting point 214 to capacitor electrode 216. First connecting point 212 is substantially all within the edges of nth data line 204, to which it is electrically connected. The edges of capacitor electrode 216 are aligned with the edges of (m+1)th scan line 202, forming a capacitive element.

The cell's circuitry also includes second semiconductor pattern 220, a line that crosses first semiconductor pattern 210 at channels 222 and 224. Second semiconductor pattern 220 extends from end 226, at which it is electrically connected to mth scan line 200.

The layout in FIG. 4 is designed to have the following dimensions when implemented with poly-Si TFTs on an insulating substrate: Each cell is 30 μm×30 μm, of which the scan line occupies 6 μm and the data line occupies 5 μm. The lines in first semiconductor pattern 210 are 2 μm wide, and second semiconductor pattern 220 is 2.5 μm wide. In general, the smallest features are 2 μm and the smallest separations are 3 μm, with 1.0 μm overlay and an aperture ratio of 49.7%.

The cell circuitry in FIG. 4 is designed so that the capacitive element formed by (m+1)th scan line 202 and capacitor electrode 216 has sufficient capacitance that stored voltages are not significantly affected by capacitive coupling with data line voltage fluctuations. Dark matrix is used to improve image quality by blocking stray illumination, as at edges, with minimum sacrifice of aperture.

Figure 5:
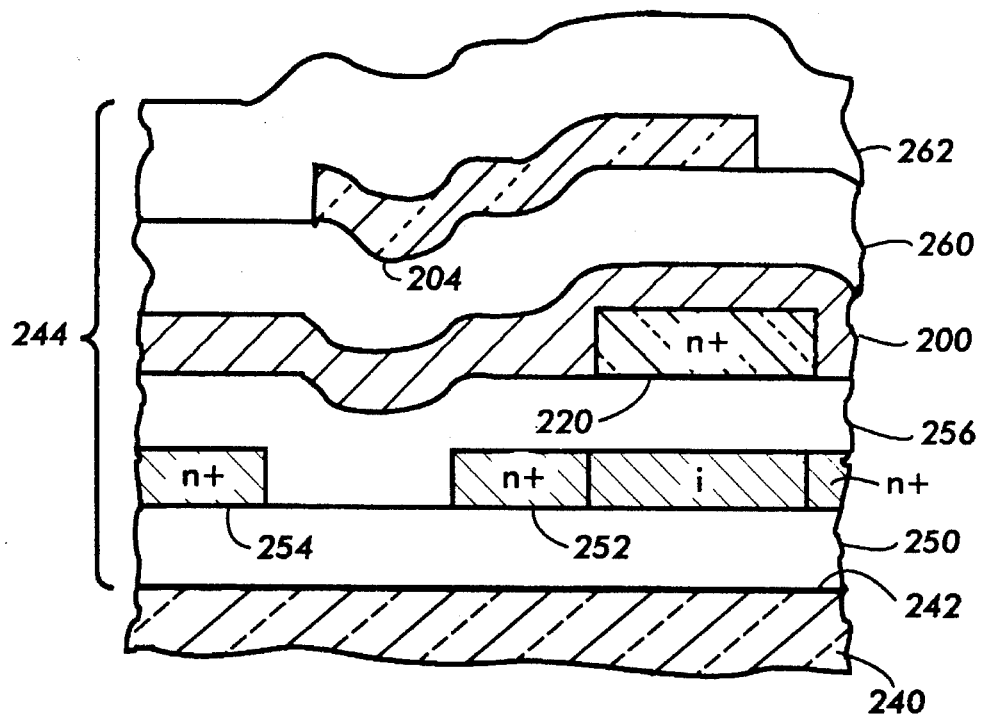
FIG. 5 is a schematic cross section along line a—a in FIG. 4.

FIG. 5 shows substrate 240, which can be quartz, with surface 242 at which circuitry 244 is formed. Circuitry 244 includes insulating layer 250 on surface 242, on which capacitor electrodes 252 and 254 are formed for the cell circuitry connected to the (m−1)th scan line and to the nth and (n−1)th data lines respectively. Capacitor electrodes 252 and 254 each include heavily n-doped poly-Si, as indicated by "n+," except that a small area of electrode 252 that is under second semiconductor pattern 220 is undoped, intrinsic poly-Si, as indicated by "i." If the area in which second semiconductor pattern 220 overlaps capacitor electrode 252 is small, as in FIG. 4, this small undoped area has an insignificant effect on capacitance.

Circuitry 244 also includes insulating layer 256 between capacitor electrodes 252 and 254 and second semiconductor pattern 220 shown in FIG. 4. Second semiconductor pattern 220 also includes heavily n-doped poly-Si, and is electrically connected to mth scan line 200, which includes aluminum, and which can be implemented as a hybrid TiW/AlCu stack. Because of the small overlap with second semiconductor pattern 220 and because of a slight dip between capacitor electrodes 252 and 254, mth scan line has slight variations in cross section, but in general its section remains substantially uniform across the array.

Circuitry 244 then includes insulating layer 260 separating mth scan line 200 from nth data line 204, which can also be implemented as a hybrid TiW/AlCu stack. Over nth data line 204 is passivation layer 262 of polyimide.

Figure 6:
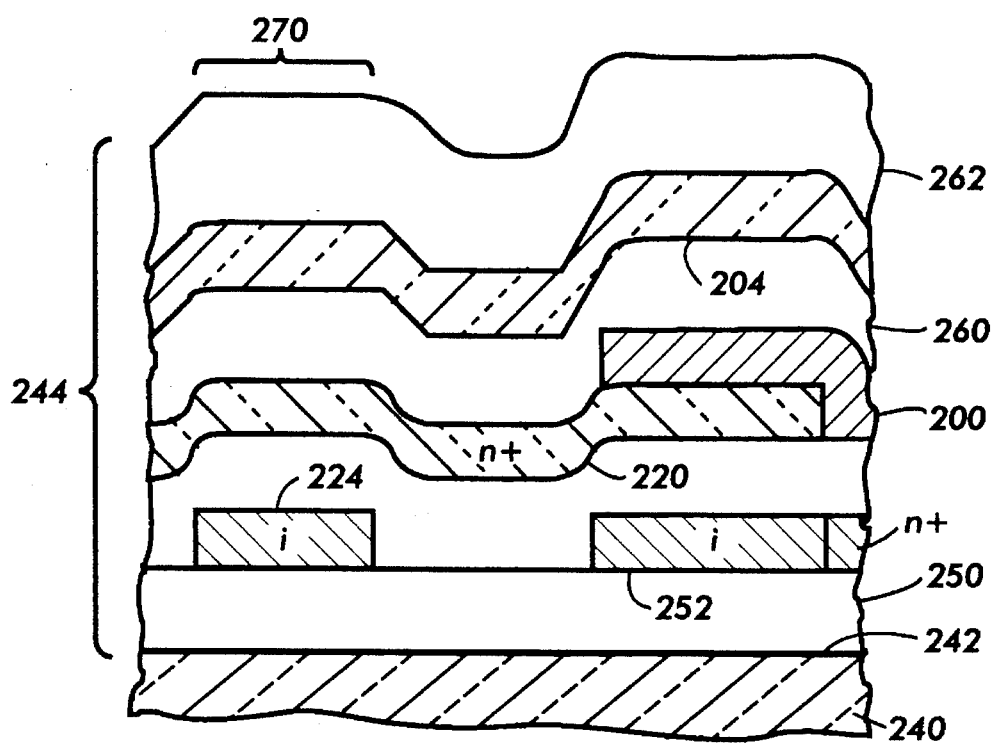
FIG. 6 is a schematic cross section along line b—b in FIG. 4.

FIG. 6 shows a different cross section of circuitry 244, with many of the same features as FIG. 5, but also showing channel 224 in first semiconductor pattern 210. As shown, second semiconductor pattern 220 provides signals from mth scan line 200 to channel region 270, controlling conductivity of channel 224.

Figure 7:
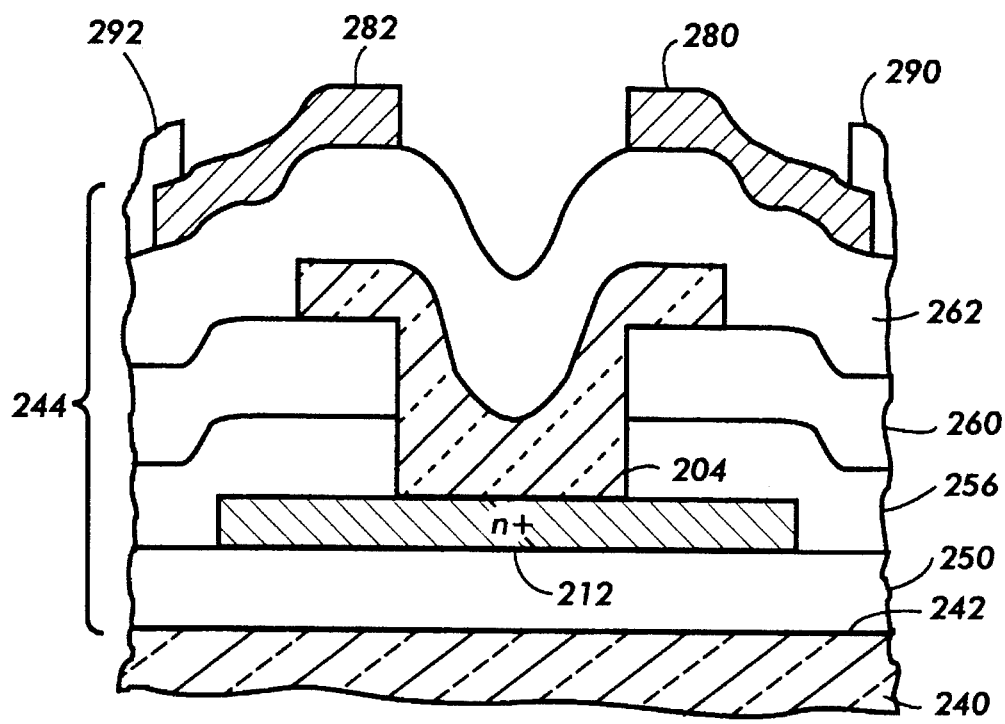
FIG. 7 is a schematic cross section along line c—c in FIG. 4.

FIG. 7 shows a cross section through first connecting point 212. As shown, nth data line 204 forms a metal/semiconductor contact with first semiconductor pattern 210 through an opening in insulating layers 256 and 260. Dark matrix lines 280 and 282 are formed on passivation layer 262 over the edges of nth data line 204, and indium tin oxide (ITO) pixel electrodes 290 and 292 slightly overlap dark matrix lines 280 and 282.

Figure 8:
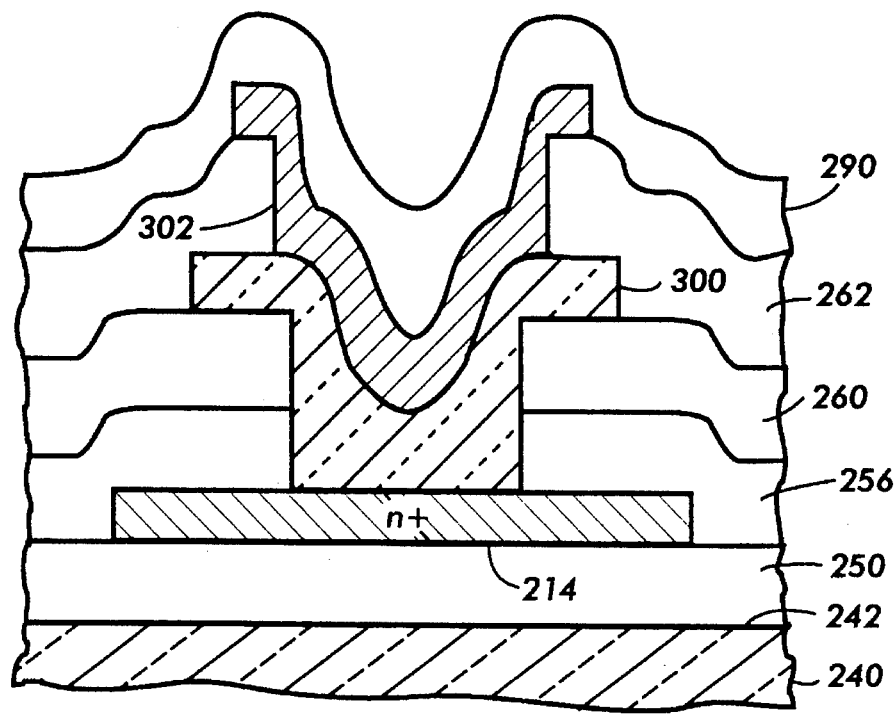
FIG. 8 is a schematic cross section along line d—d in FIG. 4.

FIG. 8 shows a cross section through second connecting point 214. Metal pattern 300 forms a metal/semiconductor contact with first semiconductor pattern 210 through an opening in insulating layers 256 and 260. Metal pattern 300 can be formed from the same metal layer as nth data line 204. Conductive dark matrix pattern 302 can be formed from the same material as dark matrix lines 280 and 282 in FIG. 7. ITO pixel electrode 290 then forms an electrical connection with second connecting point 214 through metal pattern 300 and dark matrix pattern 302. Although metal pattern 300 blocks stray illumination at the edges of insulating layers 256 and 260 and smooths the topology, dark matrix pattern 302 provides process compatibility between ITO pixel electrode 290 and metal pattern 300.

C.2. Fabrication

Figure 9:
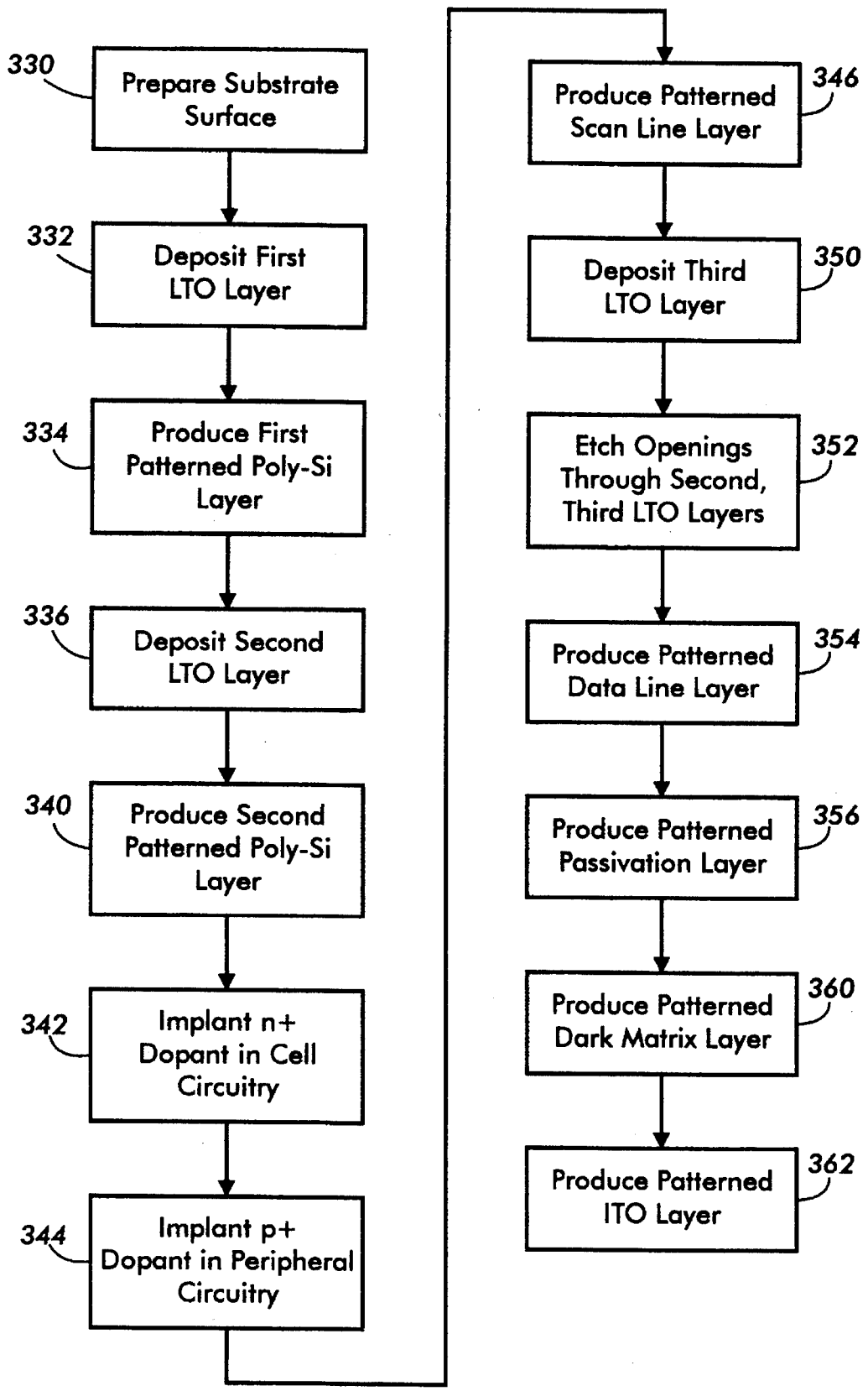
FIG. 9 is a flow chart showing acts in producing cell circuitry as in FIG. 4.

FIG. 9 shows acts in producing cell circuitry as described above.

The act in box 330 begins by preparing a surface of a quartz substrate. The act in box 330 can include any necessary cleaning.

The act in box 332 then deposits a first layer of low temperature oxide (LTO), which can be $SiO_2$ deposited with plasma chemical vapor deposition. The first LTO can be deposited to a thickness of 0.7 μm and then annealed.

The act in box 334 deposits a layer of a-Si to a thickness of 0.1 μm, then performs Si self-ion implantation to enhance performance. The act in box 334 also performs crystallization and annealing at 600° C. As a result, the a-Si becomes poly-Si. The act in box 334 performs lithography to produce a pattern of mask material that covers the parts of the poly-Si that form first semiconductor pattern 210. Then, the act in box 334 etches to remove areas not covered by the pattern of mask material, leaving first semiconductor pattern 210.

The act in box 336 deposits a second layer of LTO to a thickness of 0.085 μm. The act in box 336 also performs oxidation at 950° C. under 150 atmospheres and anneals the second LTO layer.

The act in box 340 deposits a layer of poly-Si to a thickness of 0.35 μm. The act in box 340 performs lithography to produce a pattern of mask material that covers the parts of the poly-Si that form second semiconductor pattern 220 or another similar pattern that crosses the first semiconductor pattern at one or two channels. Then, the act in box 340 etches to remove areas not covered by the pattern of mask material, leaving second semiconductor pattern 220. Then, the act in box 340 removes the mask material.

The act in box 342 performs lithography to produce a pattern of mask material that does not cover the cell circuitry, but may, for example, cover areas in which peripheral circuitry is being formed on the substrate. The act in box 342 then implants a heavy concentration of an n-type dopant, making second semiconductor pattern 220 conductive and forming conductive leads in first semiconductor pattern 210. Then, the act in box 342 removes the mask material by an appropriate plasma resist etching.

The act in box 344 similarly performs lithography to produce a pattern of mask material that does not cover the peripheral circuitry, but covers the cell circuitry. The act in box 344 then implants a heavy concentration of a p-type dopant to form conductive areas in the peripheral circuitry. Then, the act in box 344 removes the mask material. The act in box 344 can also perform crystallization annealing at 600° C.

Because they implant heavy concentrations of dopants, the acts in boxes 342 and 344 may employ any of a number of implantation processes, including non-mass selection processes such as ion showering, plasma extraction, ion bucket, and so forth.

The act in box 346 deposits a layer of metal to a thickness of 0.1–0.2 μm to produce a scan line layer. The scan line layer can, for example, be a hybrid TiW/AlCu multilayer stack with three or four layers of 0.01 μm of TiW separated by two or three layers of 0.05 of AlCu, similar to the multilayer metal lines described in copending, coassigned U.S. patent application No. 08/234,897, now issued as U.S. Pat. No. 5,518,805, entitled "Hillock-Free Multilayer Metal Lines for High Performance Thin Film Structures," incorporated herein by reference. The hybrid films can be sputtered or evaporated using two alloy targets, alternating between the targets. These thicknesses avoid hillock formation in the AlCu layers during processing, yet provide a thin barrier metal to avoid intermixing between the AlCu layers or between an AlCu layer and other layers, avoiding hillock formation, film bubbling, peeling, or spiking into a poly-Si layer, for example. The films can all be wet etched at approximately the same rate to achieve a high degree of dimension control. The ratio of the wet TiW etchant to the wet AlCu etchant can be approximately 50:1; in contrast to the standard Al etchant, this mixed etchant is much lower in viscosity and less violent during etching, removing bubbling.

The act in box 346 then performs lithography to produce a pattern of mask material that covers the parts of the scan line layer that form the scan lines. Then, the act in box 346 etches to remove areas not covered by the pattern of mask material, leaving the scan lines. Then, the act in box 346 removes the mask material.

The act in box 350 deposits a third layer of LTO to a thickness of 0.7 μm. The act in box 350 also performs hydrogenation to passivate the channels in first semiconductor pattern 210 and an appropriate wet oxide etch to remove the damaged layer resulting from the hydrogenation process. This hydrogenation does not cause degradation of channels in first semiconductor pattern 210 because the scan lines formed in box 346 are not over the channels in first semiconductor pattern 210.

The act in box 352 performs lithography to produce a pattern of mask material that does not cover first and second connection points 212 and 214 and any other areas in which metal in the data line layer contacts the layer formed in box 334, but covers all other areas. The act in box 352 then etches to form openings in the second and third LTO layers from boxes 336 and 350 in the areas that are not covered. Then, the act in box 352 removes the mask material.

The act in box 354 deposits a data metal layer to a thickness of 0.5 μm. The data metal layer can, for example, be a hybrid TiW/AlCu multilayer stack as described above. The act in box 354 then performs lithography to produce a pattern of mask material that covers the parts of the data line layer that form the data lines and that cover the opening to second connection point 214. Then, the act in box 354 etches to remove areas not covered by the pattern of mask material, leaving the data lines. Then, the act in box 354 removes the mask material.

The data line layer over second connection point 214 blocks light leakage due to poor liquid crystal control as a result of the steepness of the topology. This light leakage blocking raises contrast ratio dramatically.

The act in box 356 deposits a passivation layer of polyimide to a thickness of 1.5 μm. The act in box 356 performs lithography to produce a pattern of mask material that does not cover second connection point 214 and any other areas in which metal in the data line layer should be exposed for contact. The act in box 356 then etches to form openings in the passivation layer in the areas that are not covered. Then, the act in box 356 removes the mask material.

The passivation layer also acts to planarize the surface, and spin-on glass could be used instead of polyimide. Planarization is important because of the steepness of the topology.

The act in box 360 deposits a dark matrix layer of TiW to a thickness of 0.1 μm. TiW is advantageous as a dark matrix material because it acts as a mutual etch stop with indium-tin-oxide (ITO) and aluminum and has a high optical density even in a thin layer, and it is advantageously applied over the circuitry rather than on a cover sheet. The act in box 360 performs lithography to produce a pattern of mask material that covers the dark matrix layer only in areas in which light shielding is needed, such as along the edges of each data line and around second connection point 214. The act in box 360 then etches to remove the areas that are not covered. Then, the act in box 360 removes the mask material.

The act in box 362 deposits ITO to a thickness of 0.055 μm. The act in box 362 performs lithography to produce a pattern of mask material that covers the ITO layer in light transmissive cell areas. The act in box 362 then etches to remove the areas that are not covered. Them the act in box 362 removes the mask material and anneals the ITO layer at 280° C.

C.3. Display

Figure 10:
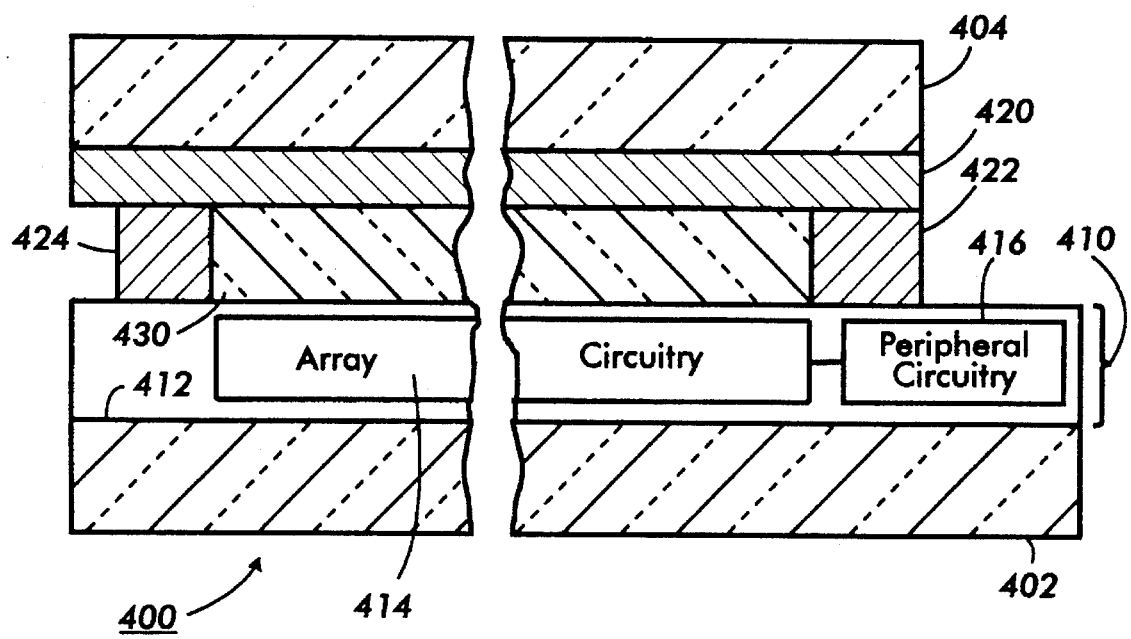
FIG. 10 is a cross section of a display that includes an array produced as shown in FIG. 9.

FIG. 10 shows features of a display that includes circuitry produced as described above.

Display 400 in FIG. 10 includes array substrate 402 and cover substrate 404. Array substrate 402 is quartz, but cover substrate 404 could be quartz or glass.

Circuitry 410 formed at surface 412 of array substrate 402 includes array circuitry 414 and peripheral circuitry 416. Peripheral circuitry 416 is outside the boundary of array circuitry 414, and can include drivers connected to the ends of scan lines and data lines. As described above, array circuitry 414 can have n-doped poly-Si TFTs, while peripheral circuitry 416 can have p-doped poly-Si TFTs.

ITO layer 420 is formed at a surface of cover substrate 404 and faces surface 412 of array substrate 402, separated by spacers 422 and 424 at the boundary of array circuitry 414. If display 400 is a projection device, it should be small enough that no other spacers are needed within the boundary of array circuitry 414, because spacers can cause image problems in a projection display. The need for spacers can be reduced by using thicker substrates and by assembling at lower temperatures.

Display 400 also includes liquid crystal material 430 in the cavity defined by ITO layer 420, array circuitry 414, and spacers 422 and 424. Liquid crystal material 430 can be a 90° twisted nematic liquid crystal.

Display 400 could, for example, be a wafer-scale projection display of approximately 1.5" diagonal. Display 400 could alternatively be a large area direct viewing display.

Display 400 can be assembled using techniques like those described in copending, coassigned U.S. patent application No. 08/235,011, now issued as U.S. Pat. No. 5,491,347, entitled "Thin-Film Structure with Dense Array of Binary Control Units for Presenting Images," incorporated herein by reference.

C.4. Results

The techniques described above have been simulated and compared with prior art techniques. Simulation results have shown significantly reduced cross talk and improved image quality, in part due to much larger storage capacitance and in part due to smaller gate and parasitic capacitances in the TFTs.

A dummy 30×30 array of cells with no liquid crystal assembly has been manufactured, tested, and found to be fully functional.

1280×1024 arrays have been successfully manufactured, both wafer-scale and large area. The wafer-scale arrays employ conventional 2 μm CMOS technology, while the large area arrays employ conventional 3 μm CMOS technology.

Results to date indicate that the wafer-scale and large area arrays will be fully functional when assembled and that the circuitry is scalable to 1 μm or smaller CMOS technology.

C.5. Variations

The implementation described above provides thin film circuitry on an insulating substrate. The invention could be implemented with other types of circuitry on other types of substrates.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used, such as thinner semiconductor and gate oxide layers to improve TFT performance or to increase storage capacitance. Rather than poly-Si, other semiconductor materials could be used in the semiconductor layers, including but not limited to a-Si, SiGe, CdSe, or a composite layer of poly-Si and SiGe. Similarly, various conductive materials could be used in the scan lines and data lines, including but not limited to ITO, MoTa, Cr, MoCr, Ta, Cu, Ti, TiN, and organic conductive materials.

The implementation described above includes layers in a specific sequence, but the sequence of layers could be modified, such as by producing bottom gate TFT structures.

The implementation described above forms a semiconductor line that is heavily doped except in channels at which it crosses a gate line, but other doping techniques could be used. For example, doping could be lowered to reduce leakage current as described in copending, coassigned U.S. patent application 08/277,719, entitled "Reduced Leakage Current Multiple Gate Thin Film Transistors," incorporated herein by reference.

The implementation described above forms an array with a metal scan line controlling a semiconductor gate line in accordance with the invention described in copending, coassigned U.S. patent application 08/368,123, continued as 08/572,357, entitled "Array with Metal Scan Lines Controlling Semiconductor Gate Lines," incorporated herein by reference. The invention could, however, be implemented to form other arrays.

The implementation described above forms a gate line that crosses a semiconductor line at two channels in accordance with the invention described in copending, coassigned U.S. patent application 08/367,984, entitled "Circuitry with Gate Line Crossing Semiconductor Line at Two or More Channels," incorporated herein by reference. The invention could, however, form a single channel or form multiple gates of other kinds.

D. Application

The invention could be applied in many ways, including arrays for displays, sensors, and light valves.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed :

1. A method of forming array circuitry at a surface of a substrate; the method comprising:

forming a first patterned conductive layer that includes M scan lines, where M is greater than 1; each of the scan lines extending approximately in a first direction across the surface of the substrate; the M scan lines being positioned in order from first through Mth; each of the scan lines including metal;

forming a second patterned conductive layer that includes N data lines, where N is greater than 1; each of the data lines extending approximately in a second direction across the surface of the substrate; the second direction being different than the first direction; the N data lines being positioned in order from first through Nth; the array circuitry including, for each value of m from 1 through M and for each value of n from 1 through N, a crossing region in which the mth scan line and the nth data line cross; and forming cell circuitry for each of a set of at least one of the crossing regions; the cell circuitry of each crossing region in the set being connected to the mth scan line and the nth data line; the cell circuitry of each crossing region in the set including a component having a data lead for receiving signals from or providing signals to the nth data line; the act of forming cell circuitry comprising:

forming a first patterned semiconductor layer; the first patterned semiconductor layer including, for each crossing region in the set, a first line extending between a first connecting point for connecting to the nth data line and a second connecting point for connecting to the data lead; the first line including a channel between the first and second connecting points; and forming a second patterned semiconductor layer; the second patterned semiconductor layer including, for each crossing region in the set, a second line that extends from a third connecting point for connecting to the mth scan line; the second line crossing the first line at the channel; the second line being conductive;

the acts of forming the first patterned conductive layer, the second patterned conductive layer, and the cell circuitry comprising:

forming electrical connections at the first, second, and third connecting points so that signals on the mth scan line control conductivity of the first line between the nth data line and the data lead.

2. The method of claim 1 in which each of the first and second patterned semiconductor layers is a polysilicon layer.

3. The method of claim 1 in which the first patterned semiconductor layer is formed before the second patterned semiconductor layer so that the channel is between the second line and the substrate.

4. The method of claim 1 in which the first patterned semiconductor layer includes the data lead connected to the first line; the act of forming electrical connections comprising, after the first patterned semiconductor layer is formed:

implanting a dopant; the act of implanting the dopant doping the data lead and a connected part of the first line so that the data lead and the first line are electrically connected.

5. The method of claim 1 in which the first patterned semiconductor layer includes, for each crossing region in the set, a capacitor electrode connected to the first semiconductor line by the data lead; the act of forming the cell circuitry further comprising:

depositing a first unpatterned semiconductor layer;

performing lithography to produce a first pattern of mask material; the first pattern covering parts of the first unpatterned semiconductor layer that form, for each crossing region in the set, a connected shape that includes the first line, the data lead, and a capacitor electrode along a part of the mth scan line;

etching to remove areas of the first unpatterned layer not covered by the first pattern of mask material so that the covered parts of the first unpatterned semiconductor layer remain; and forming an insulating layer between the capacitor electrode and the mth scan line so that the capacitor electrode and the mth scan line can act as a capacitive element.

6. The method of claim 5 in which the first patterned semiconductor layer is formed before the insulating layer and the insulating layer is formed before the first patterned conductive layer, so that the insulating layer and the capacitor electrode are between the mth scan line and the substrate.

7. The method of claim 5 in which the first patterned semiconductor layer is formed before the second patterned semiconductor layer; the act of forming electrical connections further comprising, after the second patterned semiconductor layer is formed:

implanting a dopant; the dopant doping the second line, parts of the first line other than the channel, and the capacitor electrode so that the second line and the capacitor electrode are conductive and so that the first line has a conductive first channel lead electrically connected to the first connecting point and a conductive second channel lead electrically connected to the capacitor electrode.

8. The method of claim 5 in which the second patterned conductive layer is formed after the insulating layer is formed; the act of forming electrical connections comprising:

performing lithography to produce a connection pattern of mask material; the connection pattern covering parts of the insulating layer except, for each crossing region in the set, the first connecting point of the first line;

etching to remove areas of the insulating layer not covered by the connection pattern of mask material so that the covered parts of the insulating layer remain, the remaining parts defining, for each crossing region in the set, an opening to the first connecting point of the first line; and depositing a data line layer over the insulating layer so that the data line layer goes through openings defined by the remaining parts of the insulating layer and, for each crossing region in the set, forms a connecting interface between the data line layer and the first line at the first connecting point;

the act of forming the second patterned conductive layer comprising:

performing lithography to produce a data line pattern of mask material; the data line pattern covering parts of the data line layer that form the N data lines; and etching to remove areas of the data line layer not covered by the data line pattern of mask material so that the covered parts of the data line layer remain; the covered parts forming the N data lines.

9. The method of claim 1 in which the act of forming electrical connections comprises forming a metal/semiconductor interface between the mth scan line and the second line at the third connecting point.

10. The method of claim 9 in which the first patterned conductive layer is formed after the second semiconductor layer; the act of forming the first patterned conductive layer comprising:

depositing a scan line layer that includes metal over the second line to form the metal/semiconductor interface;

performing lithography to produce a scan line pattern of mask material; the scan line pattern covering parts of the scan line layer that form the M scan lines; and etching to remove areas of the scan line layer not covered by the scan line pattern of mask material so that the covered parts of the scan line layer remain; the covered parts forming the M scan lines.

11. In a method of producing an array that includes:

a substrate with a surface at which circuitry is formed;

array circuitry at the surface of the substrate; the array circuitry including:

a set of two or more scan lines, each of the scan lines extending approximately in a first direction across the surface of the substrate;

a set of two or more data lines; each of the data lines extending approximately in a second direction across the surface of the substrate; the second direction being different than the first direction so that each of the scan lines and each of the data lines cross in a crossing region;

for each of a set of one or more of the crossing regions, cell circuitry connected to the scan line and the data line that cross in the crossing region; the cell circuitry of each crossing region in the set including:

a component having a data lead for receiving signals from or providing signals to the data line; and connecting circuitry for electrically connecting the data lead to the data line under control of the scan line; the connecting circuitry including:

a semiconductor line electrically connected between the data line and the data lead; and a gate line that crosses the semiconductor line; the semiconductor line including a channel where the gate line crosses it; the gate line being electrically connected to the scan line so that signals on the scan line control conductivity of the channel in the semiconductor line;

an improvement comprising:

forming the scan lines in a first layer; the first layer being a highly conductive layer; the first layer being a layer that would, if it crossed the semiconductor line at the channel, cause fabrication problems; and forming the gate lines of the connecting circuitry of the cell circuitry of all of the crossing regions in the set in a second layer; the second layer being less conductive than the first layer; the second layer being compatible so that the gate line's crossing the semiconductor line at the channel does not cause fabrication problems.

12. The improvement of claim 11 in which the first layer is a hybrid TiW/AlCu multilayer stack.

13. The improvement of claim 11 in which the second layer is a semiconductor layer.

14. The improvement of claim 13 in which the second layer is a polysilicon layer.

15. The improvement of claim 13 in which the first layer is a metal layer, the improvement further comprising:

forming, for each gate line, a metal/semiconductor interface between the first layer and the second layer, each gate line's metal/semiconductor interface providing electrical connection between the gate line and the scan line to which the gate line is electrically connected.

16. The improvement of claim 15 in which the act of forming a metal/semiconductor interface and the act of forming the scan lines are performed after the act of forming the gate lines; the act of forming a metal/semiconductor interface comprising:

depositing the first layer over the gate lines to form each gate line's metal/semiconductor interface;

the act of forming the scan lines comprising:

lithographically patterning the first layer to produce the scan lines.

17. The improvement of claim 15 in which the act of forming a metal/semiconductor interface and the act of forming the gate lines are performed after the act of forming the scan lines; the act of forming a metal/semiconductor interface comprising:

depositing the second layer over the scan lines to form each gate line's metal/semiconductor interface;

the act of forming the gate lines comprising:

lithographically patterning the second layer to produce the gate lines.

18. The improvement of claim 13 in which the cell circuitry of each crossing region in the set further includes a capacitor electrode connected to the semiconductor line by the data lead; the capacitor electrode being separated from an adjacent one of the scan lines by an insulating layer to form a capacitive element; the adjacent one of the scan lines having edges extending in the first direction; the capacitor electrode having edges extending in the first direction; the improvement further comprising:

forming the capacitor electrode so that its edges extending in the first direction are aligned with the edges of the adjacent one of the scan lines.

19. The improvement of claim 18 in which the capacitor electrode, the semiconductor line, and the data lead of the cell circuitry of all the crossing regions in the set are formed in a third layer; the third layer being a semiconductor layer; the act of forming the gate lines comprising:

depositing the second layer over the capacitor electrode, the semiconductor line, and the data lead of the cell circuitry of all the crossing regions;

lithographically patterning the second layer to produce the gate lines; and implanting a dopant; the dopant doping the gate lines, parts of the semiconductor line other than the channel, the data lead, and the capacitor electrode so that the second line and the capacitor electrode are conductive and so that the semiconductor line is electrically connected to the capacitor electrode through the data lead.

20. A method of forming array circuitry at a surface of a substrate; the method comprising:

forming two or more scan lines in a first patterned conductive layer; each of the scan lines extending approximately in a first direction across the surface of the substrate;

forming two or more data lines in a second patterned conductive layer; each of the data lines extending approximately in a second direction across the surface of the substrate; the second direction being different than the first direction so that each scan line crosses each data line in a crossing region; and forming cell circuitry for each of a set of at least one of the crossing regions; the cell circuitry of each crossing region in the set being connected to the scan line and the data line that cross in the crossing region; the cell circuitry of each crossing region in the set including a component having a data lead for receiving signals from or providing signals to the data line; the act of forming cell circuitry comprising:

forming in a patterned semiconductor layer, for each crossing region in the set, a semiconductor line extending between a first connecting point for connecting to the crossing region's data line and a second connecting point for connecting to the data lead; the semiconductor line including a channel between the first and second connecting points; and forming in a patterned gate layer, for each crossing region in the set, a gate line that extends from a third connecting point for connecting to the crossing region's scan line; the gate line crossing the semiconductor line at the channel;

the first patterned conductive layer being a highly conductive layer; the first patterned conductive layer being a layer that would, if it crossed the semiconductor line at the channel, cause fabrication problems; and the gate line layer being less conductive than the first patterned conductive layer; the gate line layer being compatible so that the gate line's crossing the semiconductor line at the channel does not cause fabrication problems;

the acts of forming the first patterned conductive layer, the second patterned conductive layer, and the cell circuitry comprising:

forming electrical connections at the first, second, and third connecting points so that, for the cell circuitry of each crossing region, signals on the crossing region's scan line control conductivity of the semiconductor line between the crossing region's data line and the data lead.

21. The method of claim 20 in which the first patterned conductive layer is a hybrid TiW/AlCu multilayer stack.

22. The method of claim 20 in which the gate line layer is a polysilicon layer.

* * * * *